United States Patent [19]
Higashiguchi et al.

[11] Patent Number: 6,038,135
[45] Date of Patent: *Mar. 14, 2000

[54] WIRING BOARD AND SEMICONDUCTOR DEVICE

[75] Inventors: Yutaka Higashiguchi; Mitsuo Inagaki; Makoto Totani; Yasuhiro Teshima, all of Kawasaki, Japan

[73] Assignee: Fujitsu Limited, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/591,119

[22] Filed: Jan. 25, 1996

[30] Foreign Application Priority Data

Jun. 30, 1995 [JP] Japan ................................. 7-166291

[51] Int. Cl.⁷ ................................................ H05K 1/18
[52] U.S. Cl. ......................... 361/778; 361/768; 361/777; 361/783; 174/261; 174/262; 257/786; 439/507
[58] Field of Search ................................. 361/760, 767, 361/768, 772–774, 776–778, 783, 792–795, 805; 174/251, 255, 261, 262, 265, 266; 439/66–71, 507; 257/700, 723, 737, 738, 778, 786

[56] References Cited

U.S. PATENT DOCUMENTS

| | | | |
|---|---|---|---|
| 4,546,413 | 10/1985 | Feinberg | 361/778 |
| 4,706,165 | 11/1987 | Takenaka et al. | 361/767 |
| 4,803,595 | 2/1989 | Kraus | 174/262 |
| 4,821,142 | 4/1989 | Ushifusa et al. | 361/739 |
| 4,894,708 | 1/1990 | Watari | 257/700 |
| 4,922,377 | 5/1990 | Matsumoto et al. | 361/792 |
| 5,110,664 | 5/1992 | Nakanishi et al. | 361/793 |
| 5,311,402 | 5/1994 | Kobayashi et al. | 361/760 |
| 5,354,955 | 10/1994 | Gregor et al. | 361/767 |
| 5,475,567 | 12/1995 | Hearn | 361/778 |
| 5,615,089 | 3/1997 | Yoneda et al. | 361/764 |
| 5,635,761 | 6/1997 | Cao et al. | 257/700 |
| 5,640,048 | 6/1997 | Selna | 257/738 |
| 5,640,051 | 6/1997 | Tomura et al. | 257/778 |
| 5,701,233 | 12/1997 | Carson et al. | 361/764 |

FOREIGN PATENT DOCUMENTS

| | | | |
|---|---|---|---|
| 62-25437 | 2/1987 | Japan | 361/778 |
| 3-6844 | 1/1991 | Japan | H01L 23/522 |

*Primary Examiner*—Leo P. Picard
*Assistant Examiner*—John B. Vigushin
*Attorney, Agent, or Firm*—Staas & Halsey LLP

[57] ABSTRACT

A wiring board to be provided between a packaged electronic component having an integrated circuit and a mother board on which the packaged electronic component should be mounted, includes a base made of an insulating material, a first circuit pattern which is provided on a first surface of the base and has terminals connectable to terminals of the packaged electronic component for external connections, and a second circuit pattern which is provided on a second surface of the base opposite to the first surface thereof and has terminals connectable to terminals provided on the mother board.

13 Claims, 8 Drawing Sheets

WIRING BOARD AND SEMICONDUCTOR DEVICE

BACKGROUND OF THE INVENTION

1. Field of the Invention

The present invention generally relates to a semiconductor device in which electronic components such as semiconductor chips are supported by a wiring board, and more particularly to a semiconductor device having projection electrodes such as electrodes of a ball grid array type (hereinafter simply referred to as BGA type).

Recently, the integration density of semiconductor chips has been drastically increased and it has been required to increase the mounting density of semiconductor devices.

Under the above situation, there has been considerable activity in the development of BGA type semiconductor devices, which has advantages in which electrodes (terminals) for external connections can be arranged on the back surfaces of the semiconductor devices at a relatively wide pitch and are hardly deformed. These advantages are attractive as compared to QFP type semiconductor devices. As the integration density of the semiconductor chips is increased, it is necessary, at the initial stage of the production of the semiconductor devices, to cope with various situations such as modifications of the functions of the semiconductor devices and unexpected problems thereof. Generally, patterns of wiring lines formed on a mother board are altered in order to cope with various situations as described above. It will be noted that the term "mother board" may be referred to as a printed circuit board, a circuit board, a wiring board, a mounting board or just board.

As a practical problem, it takes much time and a large amount of work to alter the patterns of wiring lines on the mother board. Hence, as a simple and easy way, a strap line intended to shortcircuit patterned lines on the mother board is used to achieve the necessary alteration of the circuit. Such a strap line is used on the main (mounting) surface of the mother board on which the semiconductor device is to be mounted. When the semiconductor device has terminals for external connections along edges thereof, it is possible to simply and easily modify the pattern by the strap line. However, the BGA type semiconductor devices do not have such terminals but ball-shaped terminals provided on the bottom surface of the package (more particularly, the bottom surface of the base supporting the semiconductor chip). Hence, it is impossible to extend the strap lines from the ball-shaped terminals on the mounting surface of the mother board.

2. Description of the Related Art

FIG. 1 is a perspective view of a conventional BGA type semiconductor device. A BGA type semiconductor device 10 shown in FIG. 1 is a semiconductor chip (an LSI chip) 14, which is a bare chip, a sealing part 16, and SnPb solder bumps 18 having a ball shape. The device 10 is an example of an electronic component having an integrated circuit. Electrodes (not shown) provided on the semiconductor chip 14 and electrodes provided on the front surface of the wiring board 12 are bonded together by wires. The electrodes provided on the wiring board 12 and the solder bumps 18 provided on the back surface of the wiring board 12 are electrically connected together through wiring layers and via holes formed inside the wiring board 12. The surfaces of the semiconductor chip 14 and the wiring board 12 are sealed by the sealing part 16 made of resin. The solder bumps 18 function as terminals (electrodes) for external connections, and are arranged on the back surface of the wiring board 12 in a matrix formation. Generally, the interval between the adjacent solder bumps 18 is equal to or less than 1.5 mm.

The BGA type semiconductor device 10 can be mounted on a mother board 20, which may be a glass-epoxy resin board. On the mother board 20, there are provided electrodes 22 arranged in a matrix formation and wiring lines. The semiconductor bumps 18 can be soldered to the electrodes 20 on the mother board 20 in a state in which the bumps 18 are in contact with the electrodes 20.

As described above, as the integration density of the semiconductor chip is increased, it is more frequently required to alter the circuit pattern on the mother board in order to cope with modifications of the function of the semiconductor device and problems thereof.

FIG. 3 is a diagram which shows how to provide a strap line (which is also called a jumper line) in order to perform a circuit modification in a state in which a QFP type semiconductor device 24 is mounted on a mother board. A lead terminal 26 of a QFP type semiconductor device is soldered to a land 28 formed on a mother board 20. A reference number 30 indicates a solder filet. It is now assumed that a circuit modification needs to make a connection of a strap line 36 with the lead 26. In this case, a conductor covered by an insulating coat of the strap line 36 is soldered to the land 28 by using a pulse heat tool 32 or a soldering iron 34. As will be seen from the above, it is easy to connect the strap line to the lead which outwardly extends from the edge of the semiconductor device.

However, as shown in FIG. 2, it is impossible to connect the strap line 36 to a terminal of the BGA type semiconductor device 10 (the terminal is already in the filet state) in the state in which the device 10 is already mounted on the mother board 20. Hence, a circuit modification using the strap lines cannot be made for the BGA type semiconductor devices. Hence, it is necessary to directly modify the circuit pattern formed on the mother board.

SUMMARY OF THE INVENTION

It is a general object of the present invention to overcome the above problem.

A more specific object of the present invention is to increase, rather than altering a circuit pattern on a mother board, the degree of freedom in modification of an inner circuit of a semiconductor device itself or a circuit obtained by a combination of the inner circuit and a circuit formed on the mother board.

The above objects of the present invention are achieved by a wiring board to be provided between a packaged electronic component having an integrated circuit and a mother board on which the packaged electronic component should be mounted, the wiring board comprising: a base made of an insulating material; a first circuit pattern which is provided on a first surface of the base and has terminals connectable to terminals of the packaged electronic component for external connections; and a second circuit pattern which is provided on a second surface of the base opposite to the first surface thereof and has terminals connectable to terminals provided on the mother board.

The base may comprise through holes in which conductors are provided, and the through holes electrically connect the first circuit pattern and the second circuit pattern together.

The terminals included in the first circuit patterns may comprise plate shaped portions, and the terminal included in the second circuit patterns may comprise ball-shaped portions.

The wiring board may further comprise strap terminals provided on the second surface of the base and connected to the second circuit pattern.

The electronic component may comprise a semiconductor chip.

The above objects of the present invention are also achieved by a semiconductor device comprising: a packaged electronic component having an integrated circuit; and a wiring board attached to the packaged electronic component, the packaged electronic component being mounted on a mother board through the wiring board. The wiring board comprises: a base made of an insulating material; a first circuit pattern which is provided on a first surface of the base and has terminals connectable to terminals of the packaged electronic component for external connections; and a second circuit pattern which is provided on a second surface of the base opposite to the first surface thereof and has terminals connectable to terminals provided on the mother board.

The above objects of the present invention are also achieved by semiconductor device comprising: a semiconductor chip; a base supporting the semiconductor chip; a package sealing the semiconductor chip; external connection terminals provided on a first surface of the base; and strap terminals provided on a second surface of the base, strap lines being connectable to the strap terminals, the package comprising through holes connecting the external connection terminals and the strap terminals.

The above objects of the present invention are also achieved by a wiring board on which a semiconductor device should be mounted, the wiring board comprising: a base; external connection terminals provided on a first surface of the base and connectable to external connection terminals of the semiconductor device; and strap terminals which are provided on a second surface of the base opposite to the first surface thereof, strap lines for a circuit modification being connectable to the strap terminals. The base comprises through holes connecting the external connection terminals and the strap terminals.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

A description will now be given of embodiments of the present invention.

Figure 4:
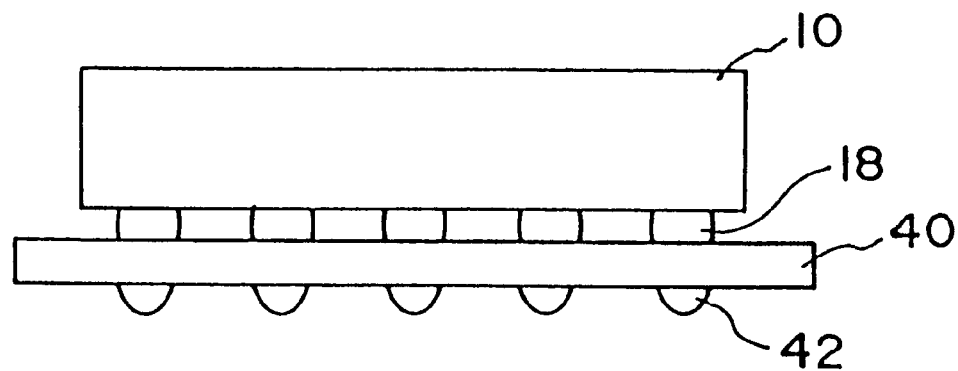
FIG. 4 is a diagram of a wiring board according to a first embodiment of the present invention and a BGA type semiconductor device attached to the wiring board.

FIG. 4 is a side view of a wiring board 40 according to a first embodiment of the present invention and the aforementioned BGA type semiconductor device 10 mounted on the wiring board 40. In FIG. 4, parts that are the same as those shown in the previously described figures are given the same reference numbers. One of the essential features of the first embodiment of the present invention is in that the wiring board 40 is interposed between the semiconductor device 10 and a mother board (not shown in FIG. 4) in order to avoid a modification of a circuit pattern formed on the mother board and realize a desired circuit modification. In this regard, the wiring board 40 can be called an auxiliary or supplementary wiring board for a circuit modification.

Figure 1:
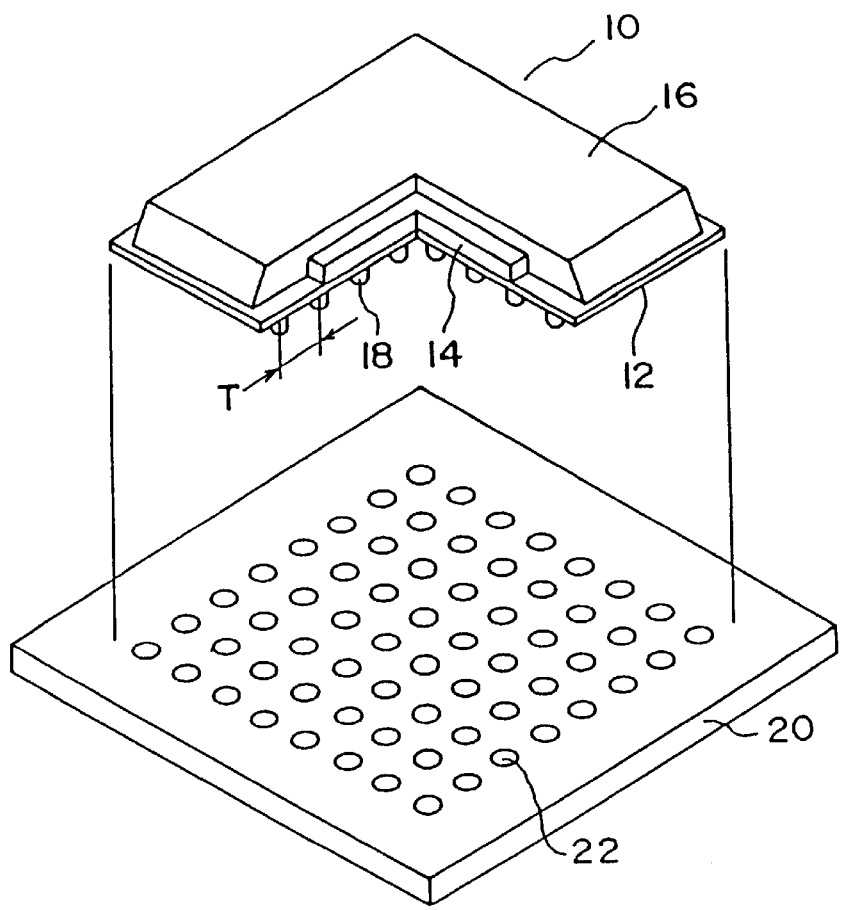
FIG. 1 is a perspective view of a conventional semiconductor device.
Figure 2:
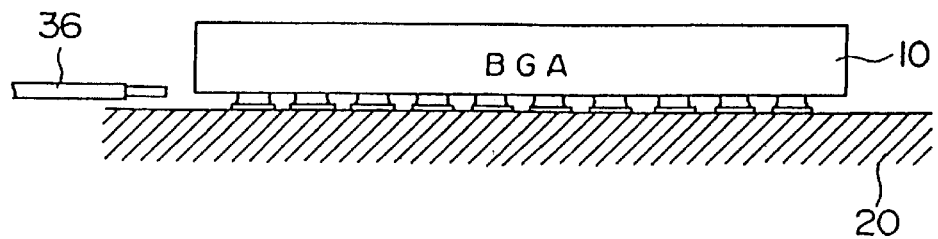
FIG. 2 is a side view of the semiconductor device shown in FIG. 1 in a state in which it is mounted on a mother board.
Figure 3:
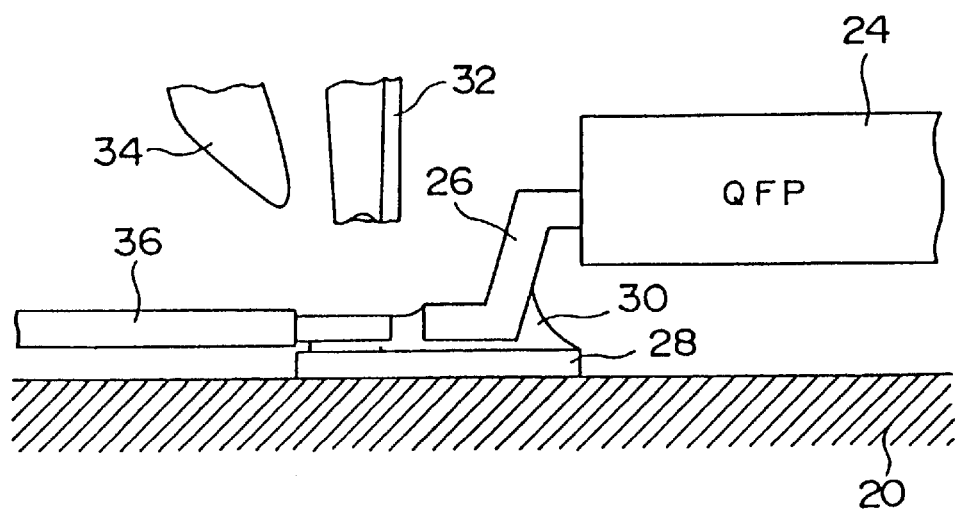
FIG. 3 is a diagram showing how to use a strap line in order to achieve a circuit modification on a semiconductor device of a type different from that of the devices shown in FIGS. 1 and 2.
Figure 5A:
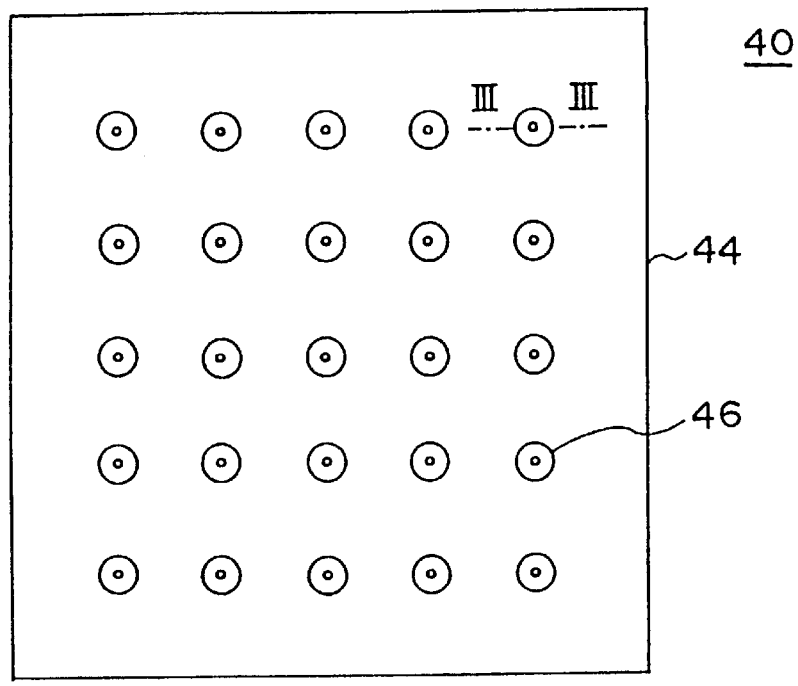
FIG. 5A is a plan view of the wiring board shown in FIG. 4.
Figure 5B:
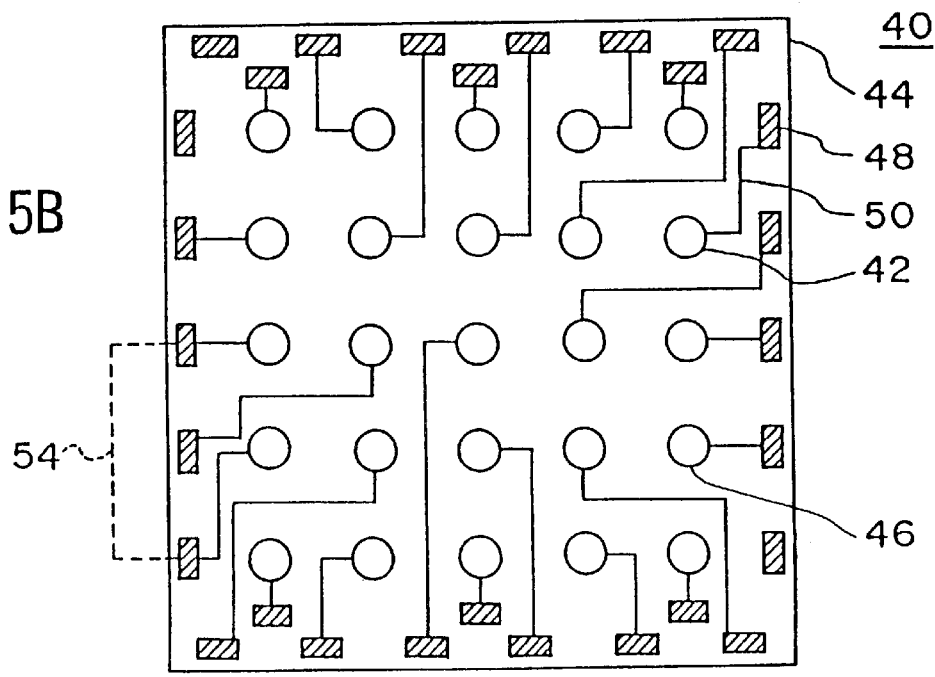
FIG. 5B is a bottom view of the wiring board shown in FIG. 4.

FIGS. 5A and 5B show the detail of the wiring board 40 shown in FIG. 3. FIG. 5A is a plan view of the wiring board 40, and FIG. 5B is a bottom view of the wiring board 40. The wiring board 40 has a base 44, which is made of an insulating material such as glass epoxy resin. A circuit pattern including a plurality of lands (plate-shaped portions) 46 is provided on a front surface (first surface) of the base 44, as shown in FIG. 5A. The lands 46 are arranged in a matrix formation. This arrangement in the matrix formation coincides with an arrangement of the solder bumps 18 of the BGA type semiconductor device 10. When the semiconductor device 10 is mounted on the wiring board 40, at least a predetermined number of bumps 18 or all the bumps 18 can be placed on the corresponding lands 46. In other words, the arrangement pitch of the lands 46 is equal to that of the solder bumps 18.

A circuit pattern is provided on a back surface (second surface) of the wiring board 40, as shown in FIG. 5B. This circuit pattern includes ball-shaped solder bumps 42, strap pads (terminals) 48, and strap wires 50 used to connect the solder bumps 42 and the strap pads 48. The solder bumps 42 are respectively provided for the lands 46. In other words, the arrangement of the solder bumps 42 has the same arrangement as that of the solder bumps 18 of the BGA type semiconductor device 10. The strap pads 48 are provided on the back surface of the base 44 in order to enable use of the strap lines.

Figure 6:
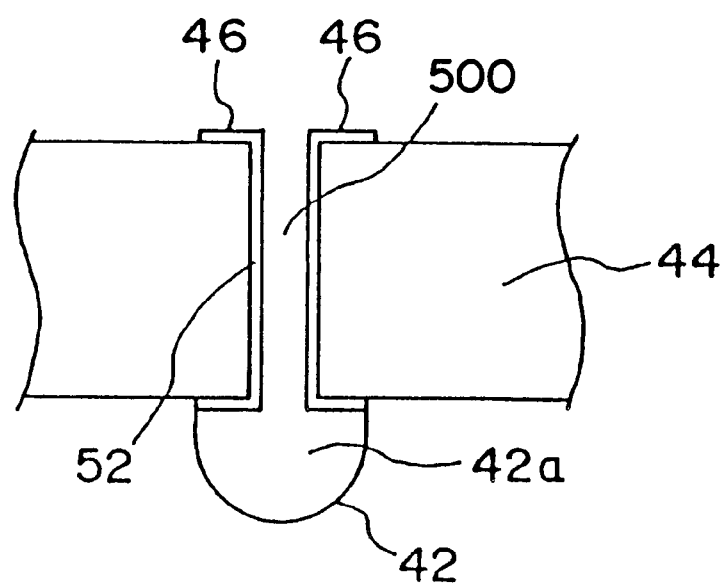
FIG. 6 is a cross-sectional view taken along line 6—6 shown in FIG. 5A.

FIG. 6 is a cross-sectional view taken along line 6—6 shown in FIG. 5A. The land 46 and the solder bump 42 are electrically connected together through a through hole 500 having a conductor 52 provided therein. The solder bump 42 includes a core portion 42a made of, for example, copper. The conductor provided in the through hole 500 can be provided by plating it with copper. The strap lines can be made of, for example, copper.

If it is required to modify a circuit including the semiconductor device 10, the semiconductor device 10 is mounted on the wiring board. Then the solder bumps 18 are melted and soldered to the lands 46. In order to realize the required circuit modification, as shown in FIG. 5B, a strap line 54 is connected to the target strap pads 48. It is possible to connect the strap line 54 to the strap pad 48 and a terminal on the mother board on which the wiring board 40 is mounted. In this way, it is possible to realize the required or desired circuit modification without any modification of the mother board.

The above wiring board 40 is a single-layer structure, and alternatively may be a multi-layer structure including a plurality of wiring layers.

Figure 7:
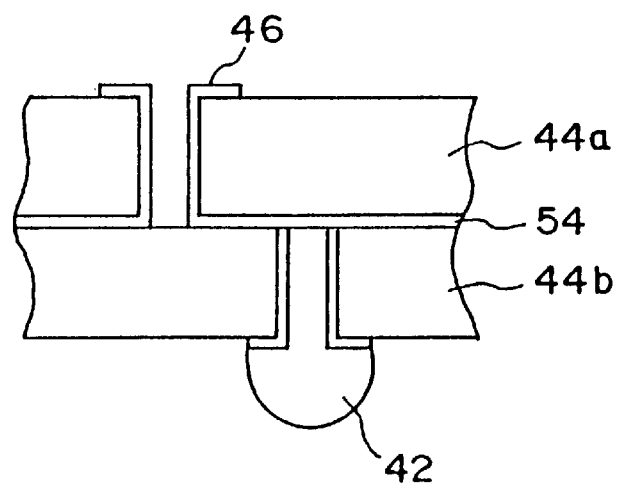
FIG. 7 is a cross-sectional view of a variation of the first embodiment of the present invention.

FIG. 7 is a cross-sectional view of a part of a multi-layer structure wiring board. The wiring board shown in FIG. 7 includes two glass epoxy resin bases 44a and 44b. An inner layer pattern 54 made of, for example, copper is provided between the bases 44a and 44b. The land 46 and the solder bump 42 are electrically connected together by the inner layer pattern 54. This increases the degree of freedom in circuit design.

A description will now be given of a second embodiment of the present invention. In order to eliminate he aforementioned disadvantage, the second embodiment of the present invention is intended to improve the structure of the mother board on which the BGA type semiconductor device should be mounted.

Figure 8:
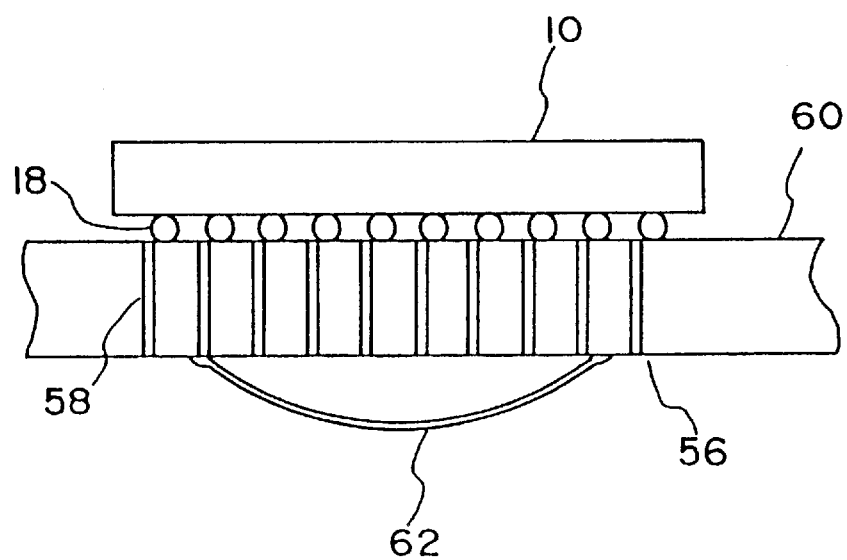
FIG. 8 is a cross-sectional view of a wiring board according to a second embodiment of the present invention and a semiconductor device mounted on the above wiring board.

FIG. 8 is a diagram showing a state in which the BGA type semiconductor device 10 is mounted on a mother board according to the second embodiment of the present invention. A mother board 60 shown in FIG. 8 is a single-layer or multi-layer structure, and has a base 60 having through holes 56. The base 60 may be glass epoxy resin.

Figure 9:
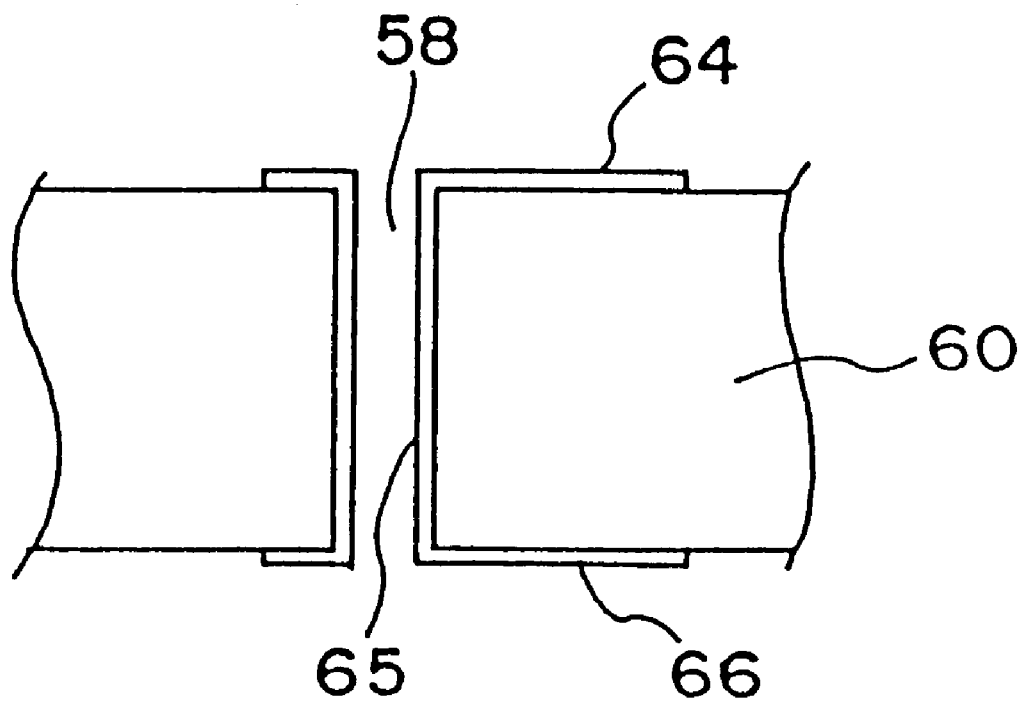
FIG. 9 is an enlarged cross-sectional view of a part of the wiring board shown in FIG. 8.

As shown in FIG. 9, a conductor such as copper is provided in each of the through holes 58, and connects a land 64 provided on the first surface of the base 60 and a land 66 provided on the second opposite surface thereof. The mother board includes a plurality of through holes 58 as shown in FIG. 8 and a plurality of lands 64 and 66. The lands 64 are arranged in a matrix formation which coincides with that of the solder bumps 18 of the BGA type semiconductor devices. Correspondingly, the lands 66 are arranged in a matrix formation. The lands 64 and 66 are located at offset positions with respect to the positions of the through holes 58.

Referring to FIG. 8, when a circuit is modified, a strap line 62 is connected to the corresponding lands 66. Thus, the solder bumps 18 corresponding to the lands 66 are short-circuited. In this way, a circuit modification can be realized without any modification of the circuit pattern formed on the mother board 56.

It is desired that the through holes 58 and the lands 64 and 66 are provided so that these elements affect the original wiring pattern. There is no need to provide the through holes for all the solder bumps 18 of the BGA type semiconductor device 10. In practice, there are some solder bumps 18 (for example, bumps related to a power supply system) that is included in a circuit which will not be modified in the future. The through holes 58 corresponding to such bumps 18 can be omitted.

A description will now be given of a third embodiment of the present invention, which is intended to improve the structure of the BGA type semiconductor device in order to eliminate the aforementioned problem.

Figure 10A:
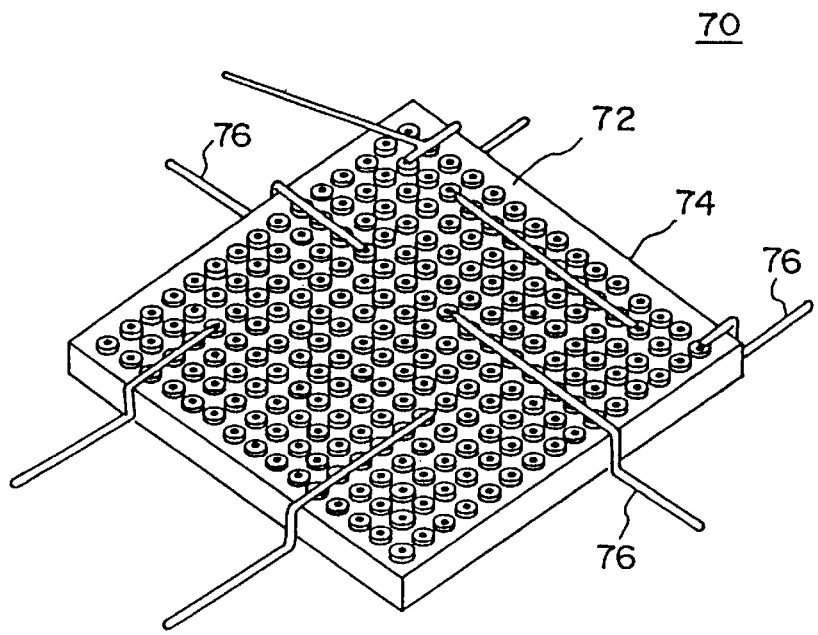
FIG. 10A is a perspective view of a semiconductor device according to a third embodiment of the present invention.
Figure 10B:
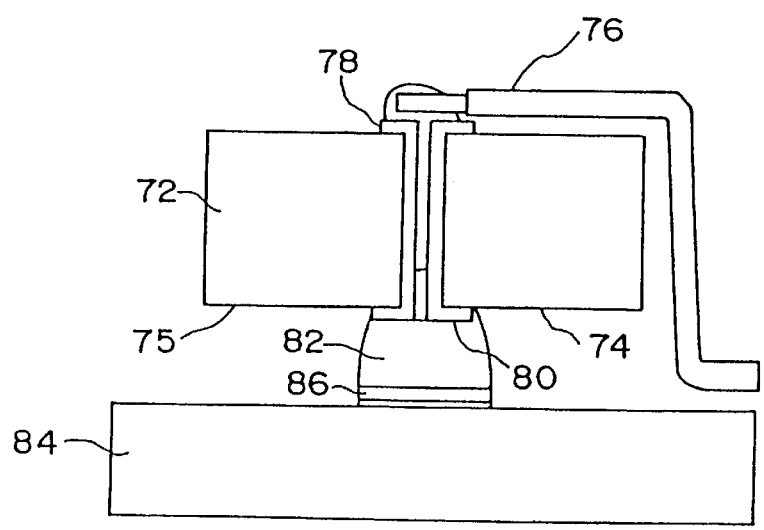
FIG. 10B is a cross-sectional view of a part of the semiconductor device shown in FIG. 10A.

FIG. 10A is a perspective view of a BGA type semiconductor device according to a third embodiment of the present invention. FIG. 10B is a cross-sectional view taken along line A—A.

A package (for example, a resin mold) 72 of a BGA type semiconductor device 70 shown in FIG. 10A has a plurality of through holes 74. A conductor 75 is provided in each of the through holes 74 by, for example, copper plating. Lands 78 are provided on the upper surface of the package 72, and lands 80 are provided on the lower surface thereof.

The strap lines 76 can be connected to the lands 78 provided on the upper surface of the package 72. In the example shown in FIGS. 10A and 10B, the strap lines 76 connected to the semiconductor device 70 are connected to elements (not shown) other than the device 70. Of course, the strap lines 76 can be used to connect the lands 78 together. The strap lines 76 has conductors and insulating layers covering the conductors. As shown in FIG. 10B, the end portion of the conductor of the strap line 76 is soldered to the land 78.

As shown in FIG. 10B, ball-shaped solder bumps 82 are provided on the lands 80 provided on the lower surface of the package 72. After the ball-shaped solder bumps 82 are soldered to lands 86 provided on a mother board 84, solder filet portions 82 are formed. It can be seen from the above that one of the essential features of the third embodiment of the present invention is in that the lands 78 connected to the lands 80 through the plated hole holes 74 are provided on the upper surface of the package 72.

According to the third embodiment of the present invention, it is possible to realize, without any modification of the circuit pattern on the mother board 84, a circuit modification in the state in which the BGA type semiconductor device 70 is attached to the mother board 84.

Figure 11:
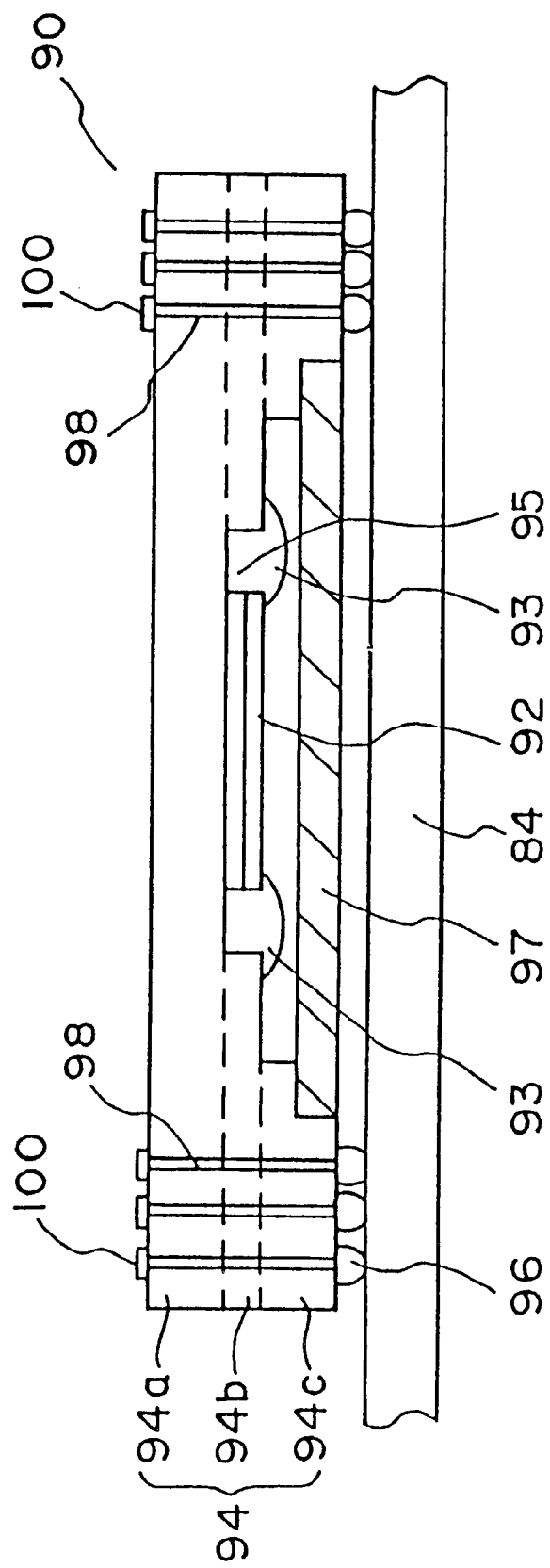
FIG. 11 is a cross-sectional view of a semiconductor device according to a fourth embodiment of the present invention.

FIG. 11 is a diagram which a BGA type semiconductor device 90 according to a fourth embodiment of the present invention. According to the fourth embodiment of the present invention, lands are provided on only peripheral upper surface portions of the package while the lands 78 are provided on the entire surface of the package 72.

The semiconductor device 90 includes a base 94 having wiring patterns. The base 94 also functions as a package. The base 94 has a three-layer structure in which three layers 94a, 94b and 94c made of, for example, glass epoxy resin, are stacked. Inner wiring patterns are interposed between the adjacent stacked layers. A recess portion 95 is provided in the center portion of the base 94. A semiconductor chip 92 is accommodated in the recess portion 95. Pads formed on the semiconductor chip 92 and pads formed on the layer 94b are bonded together by wires 93.

Ball-shaped solder bumps 96 are provided on the bottom surface of the base 94. The solder bumps 96 are electrically connected to the inner wiring patterns by means of through holes 98 in which conductors are provided. The solder bumps 96 are also connected to lands 100 provided on the upper surface of the base 94. The lands 100 correspond to the lands 78 shown in FIG. 10B. The strap lines for circuit modifications can be connected to the lands 100.

According to the fourth embodiment of the present invention, it is possible to realize, without any modification of the circuit pattern on the mother board 84, a circuit modification in the state in which the BGA type semiconductor device 90 is mounted to the mother board 84.

The present invention is not limited to the specifically disclosed embodiments, and variations and modifications may be made without departing from the scope of the present invention. For example, the present invention includes a semiconductor device having projection electrodes other than the ball-shaped electrodes.

What is claimed is:

1. A semiconductor device comprising:
   a semiconductor chip;
   a base supporting the semiconductor chip;
   a package sealing the semiconductor chip;
   external connection terminals provided on a first surface of the base; and
   strap terminals, connected to strap lines, provided on a second surface of the base,
   the package comprising through holes connecting the external connection terminals and the strap terminals.

2. The semiconductor device as claimed in claim 1, wherein said external connection terminals comprise ball-shaped portions.

3. The semiconductor device as claimed in claim 2, wherein said strap terminals comprise plateshaped portions.

4. The semiconductor device as claimed in claim 1, wherein said strap terminals comprise plate-shaped portions.

5. The combination of a wiring board and a semiconductor device, wherein said semiconductor device is mounted to said wiring board, and said wiring board includes:
   a base;
   external connection terminals provided on a first surface of the base and directly connectable to external connection terminals of said semiconductor device; and
   strap terminals, connected to strap lines for circuit modification, which are provided on a second surface of the base opposite to the first surface thereof,
   said base comprising through holes connecting the external connection terminals and the strap terminals,
   said strap terminals are connected to the external connection terminals individually through the through holes.

6. A wiring board provided between a packaged electronic component having an integrated circuit and a mother board on which the packaged electronic component is mounted, said wiring board comprising:
   a base made of an insulating material;
   a first circuit pattern which is provided on a first surface of the base and has terminals connectable to terminals of said packaged electronic component to form external connections;
   a second circuit pattern which is provided on a second surface of the base opposite to the first surface thereof, having terminals connectable to terminals provided on the mother board, wherein the terminals of the first and second circuit patterns have an arrangement identical to that of the terminals of the packaged electronic component; and
   strap terminals provided on the second surface of the base and connected to the second circuit pattern.

7. The wiring board as claimed in claim 1, wherein:
   said base comprises through holes in which conductors are provided; and
   the through holes electrically connect the first circuit pattern and the second circuit pattern together.

8. The wiring board as claimed in claim 6, wherein:
   the terminals included in the first circuit pattern comprise plate shaped portions; and
   the terminals included in the second circuit [patterns] pattern comprise ball-shaped portions.

9. The wiring board as claimed in claim 1, wherein the electronic component comprises a semiconductor chip.

10. A semiconductor device comprising:
    a packaged electronic component having an integrated circuit;
    a wiring board attached to the packaged electronic component, the packaged electronic component being mounted on a mother board through the wiring board, said wiring board comprising
    a base made of an insulating material,
    a first circuit pattern which is provided on a first surface of the base and has terminals connectable to terminals of the packaged electronic component for external connections, and
    a second circuit pattern which is provided on a second surface of the base opposite the to the first surface thereof and has terminals connectable to terminals provided on the mother board, wherein the terminals of the first and second circuit patterns have an arrangement identical to that of the terminals of the packaged electronic component; and
    strap terminals provided on the second surface of the base and connected to the second circuit pattern.

11. The semiconductor device as claimed in claim 10, wherein:
    said base comprises through holes in which conductors are provided; and
    the through holes electrically connects the first circuit pattern and the second circuit pattern together.

12. The semiconductor device as claimed in claim 10, wherein:
    the terminals included in the first circuit pattern comprise plate shaped portions; and
    the terminals included in the second circuit pattern comprise ball-shaped portions.

13. The semiconductor device as claimed in claim 10, wherein the electronic component comprises a semiconductor chip.

* * * * *

UNITED STATES PATENT AND TRADEMARK OFFICE
CERTIFICATE OF CORRECTION

PATENT NO.: 6,038,135
DATED : March 14, 2000
INVENTOR(S): Yutaka HIGASHIGUCHI et al.

It is certified that error appears in the above-identified patent and that said Letters Patent is hereby corrected as shown below:

Col. 8, line 9, delete "[patterns]".

Signed and Sealed this

Third Day of April, 2001

*Attest:*

NICHOLAS P. GODICI

*Attesting Officer*   Acting Director of the United States Patent and Trademark Office